United States Patent
Boernert et al.

(10) Patent No.: US 10,794,979 B2
(45) Date of Patent: Oct. 6, 2020

(54) REMOVAL OF IMAGE ARTIFACTS IN SENSE-MRI

(71) Applicant: KONINKLIJKE PHILIPS N.V., Eindhoven (NL)

(72) Inventors: Peter Boernert, Hamburg (DE); Miha Fuderer, Best (NL); Ivan Dimitrov, Bothell, WA (US)

(73) Assignee: Koninklijke Philips N.V., Eindhoven (NL)

( * ) Notice: Subject to any disclaimer, the term of this patent is extended or adjusted under 35 U.S.C. 154(b) by 305 days.

(21) Appl. No.: 15/780,658

(22) PCT Filed: Nov. 8, 2016

(86) PCT No.: PCT/EP2016/076908
§ 371 (c)(1),
(2) Date: Jun. 1, 2018

(87) PCT Pub. No.: WO2017/092973
PCT Pub. Date: Jun. 8, 2017

(65) Prior Publication Data
US 2018/0356484 A1 Dec. 13, 2018

Related U.S. Application Data

(60) Provisional application No. 62/262,706, filed on Dec. 3, 2015.

(30) Foreign Application Priority Data

Jan. 14, 2016 (EP) ..................... 16151326

(51) Int. Cl.
G01R 33/561 (2006.01)
G01R 33/565 (2006.01)

(52) U.S. Cl.
CPC .... *G01R 33/5611* (2013.01); *G01R 33/56509* (2013.01)

(58) Field of Classification Search
CPC ................ G01R 33/561; G01R 33/565; G01R 33/5611; G01R 33/56509; A61B 6/466
See application file for complete search history.

(56) References Cited

U.S. PATENT DOCUMENTS 6,587,707 B2 * 7/2003 Nehrke .............. G01R 33/5676
324/306
2008/0054899 A1 3/2008 Aksoy et al.
(Continued)

FOREIGN PATENT DOCUMENTS

WO 2008010126 A1 1/2008
WO 2014087270 A2 6/2014
WO 2014154544 A1 10/2014

OTHER PUBLICATIONS

"Bernstein Handbook of MRI Pulse Sequences" 2004 Section 13.3.
(Continued)

*Primary Examiner* — Son T Le

(57) ABSTRACT

The invention provides for a magnetic resonance imaging system (100, 300) comprising: a radio-frequency system (116, 122, 124, 126, 126', 126", 126'") for acquiring magnetic resonance data (152) from an imaging zone (108), wherein the radio-frequency system comprises multiple antenna elements (126, 126', 126", 126'"); a memory (140) containing machine executable instructions (170) and pulse sequence commands (150), wherein the pulse sequence commands cause the processor to acquire magnetic resonance data from the multiple antenna elements according to a SENSE protocol; and a processor. Execution of the machine executable instructions causes the processor to: control (200) the magnetic resonance imaging system with the pulse sequence commands to acquire the magnetic
(Continued)

resonance data; reconstruct (202) a preliminary image (154) using the magnetic resonance imaging data; calculate (204) a fit (159) between an anatomical model (156) and the preliminary image, wherein the anatomical model comprises a motion likelihood map (158); identify (206) at least one image artifact origin (160) at least partially using the motion likelihood map and the fit; determine (208) an extended SENSE equation (162) at least partially using at least one image artifact origin; and construct (210) a corrected SENSE image (164) using the extended SENSE equation.

14 Claims, 8 Drawing Sheets

(56) References Cited

U.S. PATENT DOCUMENTS

| | | | |
|---|---|---|---|
| 2009/0085566 A1 | 4/2009 | Kanazawa | |
| 2012/0112751 A1 | 5/2012 | Littmann et al. | |
| 2014/0073904 A1* | 3/2014 | Biber | G01R 33/56509 600/410 |
| 2014/0210469 A1* | 7/2014 | Cheng | G01R 33/56509 324/309 |

OTHER PUBLICATIONS

Winkelmann et al "Ghost Artifact Removal Using a Parallel Imaging Approach" Magn. Reson. Med. Oct. 2005; 54(4) p. 1002-9.

Alexey A. Samsonov et al: "POCS-enhanced correction of motion artifacts in parallel MRI", Magnetic Resonance in Medicine, vol. 53, No. 4, Apr. 1, 2010 (Apr. 1, 2010), pp. 1104-1110.

Winkelmann R et al: "Residual aliasing removal in higher order SENSE", Proceedings of the International Society for Magnetic Resonance in Medicine, ISMRM, 13th Scientific Meeting and Exhibition, Miami Beach, Florida, USA, May 7-13, 2005, Apr. 23, 2005 (Apr. 23, 2005), p. 2426.

Martin Uecker et al: "ESPIRiT—an eigenvalue approach to autocalibrating parallel MRI: Where SENSE meets GRAPPA", Magnetic Resonance in Medicine., vol. 71, No. 3, May 6, 2013 (May 6, 2013), pp. 990-1001.

Chu "POCs-Based Reconstruction of Multiplexed Sensitivity Encoded MRI (POSCMUSE): A General Algorithm for Reducing Motion Related Artifacts" Magn. Reson. in Med. (2014).

* cited by examiner

REMOVAL OF IMAGE ARTIFACTS IN SENSE-MRI

CROSS REFERENCE TO RELATED APPLICATIONS

This application is a U.S. national phase application of International Application No. PCT/EP2016/076908, filed on Nov. 8, 2016, which claims the benefit of U.S. provisional Application Ser. No. 62/262,706 filed Dec. 3, 2015 and EP Application Serial No. 16151326.2 filed on Jan. 14, 2016 each of which is incorporated herein by reference.

TECHNICAL FIELD OF THE INVENTION

The invention relates to magnetic resonance imaging, in particular to the removal of artifacts during SENSE magnetic resonance imaging protocols.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter antenna or antenna element cause perturbations to the local magnetic field, and RF signals emitted by the nuclear spins are detected by a receiver antenna or an array of antenna elements. These RF signals are used to construct the MRI images. These antennas or antenna elements can also be referred to as coils. The term coil is often used interchangeably to describe either an antenna or an antenna element. Further, the transmitter and receiver antennas can also be integrated into a single transceiver antenna that performs both functions. It is understood that the use of the term transceiver antenna also refers to systems where separate transmitter and receiver antennas are used. The transmitted RF field is referred to as the B1 field. During longer scan the subject can have internal or external motion which corrupts the data and results in images with blurs or artifacts.

SENSE is a parallel imaging technique. In parallel imaging techniques multiple antenna elements are used to acquire data simultaneously. Coil sensitivity maps (CSM) contains spatial sensitivity of all the antenna elements. In this case a "coil" refers to an antenna element. The coil sensitivity maps are used to combine the data acquired using each of the individual antenna elements into a single composite image. SENSE greatly accelerates the acquisition of the magnetic resonance image. Magnetic resonance parallel-imaging reconstruction techniques are briefly outlined in section 13.3 of "the handbook of MRI Pulse Sequences" by Bernstein et al. published by Elsevier Academic Press, 2004 (hereafter Bernstein et. al.)

The journal article Winkelmann et. al., "Ghost artifact removal using a parallel imaging approach," Magn. Reson. Med. 2005 October; 54(4):1002-9 (hereafter Winkelmann et. al. describes a ghost artifact removal algorithm that uses parallel imaging. An extended SENSE formulation is used to remove ghosting artifacts. An extended SENSE reconstruction is determined by numerically trying different origins for the ghosting artifact and ranking them using a consistency measure. A disadvantage of this method is that it is very numerically intensive.

SUMMARY OF THE INVENTION

The invention provides for a magnetic resonance imaging system, a computer program product, and a method of operating the magnetic resonance imaging system in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic resonance imaging system comprising a radio-frequency system for acquiring magnetic resonance data from an imaging zone. The radio-frequency system comprises multiple antenna elements. The magnetic resonance imaging system further comprises a memory containing machine-executable instructions and pulse sequence commands. The pulse sequence commands cause the processor to acquire magnetic resonance data from the multiple antenna elements according to a SENSE protocol. The SENSE or sensitivity encoding method is a well-known parallel-imaging reconstruction method used in magnetic resonance imaging. The SENSE protocol is for example reviewed in the previously mentioned textbook, Handbook of MRI Pulse Sequences by Bernstein et al in chapter 13, section 3.

The magnetic resonance imaging system further comprises a processor. Execution of the machine executable instructions causes the processor to control the magnetic resonance imaging system with the pulse sequence commands to acquire the magnetic resonance data. Execution of the machine-executable instructions further causes the processor to reconstruct a preliminary image using the magnetic resonance imaging data. In various examples the preliminary image could take different forms. For example the pulse sequence commands may also contain instructions which cause the processor to control the magnetic resonance imaging system to acquire a survey or scout image before the SENSE image data is acquired. In other examples the preliminary image may be a SENSE image reconstructed using a SENSE imaging protocol.

Execution of the machine-executable instructions further causes the processor to calculate a fit or registration between an anatomical model and the preliminary image. The anatomical model may comprise detailed anatomical data which is registered or fit to the preliminary image. In other instances the anatomical model may be a set of procedures or operations which are used to identify regions of the preliminary image. For example the anatomical model can be used to identify a region a predetermined distance from an anterior edge of a subject. The identification of this region may considered to be a fit or registration.

The anatomical model may be fit or registered to the preliminary image. Various types of anatomical models include a model which identifies anatomical landmarks, a model which uses anatomical atlas compiled from many different subjects, and a deformable shape model which is deformed to fit the particular preliminary image. The anatomical model comprises a motion likelihood map. The motion likelihood map may have data which represents a likelihood that a particular region identified by the anatomical model could be in motion during the acquisition of the magnetic resonance data. For example a region such as a diaphragm, a lung or a heart would be very likely to be in motion. In other example certain blood vessels may be marked which may be the origin of potential flow artifacts, for example due to the fresh inflow of blood. These could be given a higher value or relative value than other areas in the anatomical model. In some examples the motion likelihood map may be a probability distribution, however the motion likelihood map may also contain a simple weighting which is not normalized or scaled.

Execution of the machine-executable instructions further causes the processor to identify at least one image artifact origin at least partially using the motion likelihood map and the fit or registration. The fit or registration correlates the position in the anatomical model to the preliminary image. This enables the motion likelihood map to be applied to the preliminary image. The combination of a motion likelihood map and the fit or registration therefore allow the identification of regions within the preliminary image which are likely to cause or be the source of motion artifacts. In some examples the motion likelihood map may be applied directly to the preliminary image to identify the at least one image artifact origin. In other examples the motion likelihood map is used as a weighting in a search algorithm which is used to identify the at least one image artifact origin.

Execution of the machine-executable instructions further cause the processor to determine an extended SENSE equation at least partially using the at least one image artifact origin. During SENSE image reconstruction images acquired from each of the multiple antenna elements are reconstructed and then combined, unfolded into a single image. The extended sense equation may be represented as a linear system of equations where the sensitivity matrix has had its rank increased with additional entries to suppress or eliminate the ghosting or motion artifact. For example the sensitive matrix could have one or more additional columns added. Execution of the machine-executable instructions further causes the processor to construct a corrected SENSE image using the extended SENSE set of equations. This embodiment may have the benefit of providing for a means of effectively reducing the effects of image artifacts in SENSE reconstructed images. It may have the advantage of providing for reduced motion due to prior knowledge which is incorporated in the motion likelihood map of the anatomical model.

The at least one image artifact origin may in some instances be considered to be a physical location or a location which corresponds to a physical location in reference to the preliminary image or a later SENSE image reconstruction. For example if the preliminary image is a survey or scout image the location in particular voxels may be different but the spatial location identified by the anatomical model can be used nonetheless in a SENSE image reconstruction.

In another embodiment execution of the machine-executable instructions cause the processor to reconstruct a measured coil image for each of the multiple antenna elements using the magnetic resonance data. Execution of the machine-executable instructions further cause the processor to construct a preliminary SENSE image by using the set of coil sensitivities to combine the measured coil image of each of the multiple antenna elements according to the SENSE protocol. This may be beneficial because the preliminary SENSE image can be used for identifying the at least one image artifact origin.

In another embodiment the preliminary SENSE image is performed using an overdetermined reconstruction. In this case the number of the multiple antenna elements is greater than the SENSE factor plus a number of additional constraints. For example if there are 16 antenna elements, the SENSE factor is 3, and for every x-value there are 2 locations identified as image artifact origins then the SENSE reconstruction is over determined since 16 is greater than 3 plus 2.

In another embodiment the preliminary image comprises the preliminary SENSE image. In other words the preliminary image may be the preliminary SENSE image or the preliminary SENSE image may be part of image data which is used to make the preliminary image.

In another embodiment execution of the machine-executable instructions further cause the processor to construct a backprojected image for each of the multiple antenna elements using the preliminary SENSE image and the coil sensitivities. During a SENSE reconstruction the individual images from each of the antenna elements are combined using the coil sensitivities. In back projection the preliminary SENSE image or the reconstructed SENSE image is used with the coil sensitivities to calculate an image for each of the multiple antenna elements. If the magnetic resonance data acquired and the coil sensitivities were perfect then the back projected image and the measured coil image would be identical. This is however commonly not the case. There may be errors in the coil sensitivity matrix that cause differences between the backprojected image and the measured coil image. These errors may cause the preliminary SENSE image or portions of the preliminary SENSE image to become corrupted. Comparing the back projected image for each of the multiple antenna elements and its measured coil image therefore provides a way of evaluating how successful the SENSE reconstruction is.

Execution of the machine-executable instructions further cause the processor to compare the back projected image to the measured coil image for each of the multiple antenna elements to identify a set of affected voxels for each of the multiple antenna elements. The back projected image may be compared on a voxel to voxel basis to the measured coil image. If a voxel in the back projected image varies by more than a predetermined amount or by according to a statistical measure from measured coil image than that voxel can be appended to the set of affected voxels. A voxel of set of affected voxels is a particular voxel that differ in the back projected image and the measured coil image sufficiently to indicate that there may be an error in that voxel or in the corresponding voxel of the preliminary SENSE image.

The identification of the at least one image artifact origin is performed in image space. The identification of the at least one image artifact origin is performed at least partially using a set of affected voxels, at least partially using the motion likelihood map, and the fit or registration. The set of affected voxels may for instance be identified by comparing voxel values between the back projected image and its corresponding measured coil image. If the value of a particular voxel varies more than a predetermined threshold then it may be added to the set of affected voxels. This method may have the benefit that the set of affected voxels, the motion likelihood map and the fit or registration may be useful for identifying in space the origin of artifacts caused in the preliminary SENSE image. For example the set of affected voxels may be a ghost image or ghosting caused by motion. The combination of the three may be used to identify the at least one image artifact origin.

In another embodiment the at least one image artifact origin is corrected by numerically searching for a maximum of a consistency measure within a predetermined vicinity of each of the at least one image artifact origin before constructing the corrected SENSE image. The use of a consistency measure is detailed in Winkelmann et al. The consistency measure corresponds to the consistency check which is illustrated in FIG. 3 of Winkelmann et al and one example of the consistency measure is equation 7 in Winkelmann et al. The difficulty in using the ghost artifact removal illustrated in Winkelmann et al is that it is extremely numerically demanding. Examples as described herein may have the advantage that the prior identification of the likely motion areas in the motion likelihood map may be used to drastically accelerate the numerical process.

The consistency measure is dependent upon the difference between the set of affected voxels in the preliminary SENSE image and the back projected trial SENSE image for each of the multiple antenna elements. The back projected trial SENSE images are constructed from a trial SENSE image. The trial SENSE image is constructed using a trial SENSE equation. An example of a trial SENSE equation is equation 3 of Winkelman. There is an additional column which has been added to the coil sensitivity matrix. It is however not known where the source of the ghosting comes from. For this reason different trial SENSE equations are constructed and tried to see which results in the maximum consistency measure. The present embodiment may have the advantage that prior knowledge of where the at least one image artifact origin may be located may be used to greatly accelerate the search for the extended SENSE equation which provides the best result. The prior knowledge is expressed in terms of the anatomical model.

In another embodiment the trial SENSE equation that maximizes the consistency measure is the extended SENSE equation.

In another embodiment execution of the machine-executable instructions further cause the processor to modify the at least one image artifact origin by registering the set of affected voxels to the preliminary image. For example if the set of affected voxels identifies a ghosting artifact in the image then it may be possible to simply register the set of affected voxels directly to the preliminary image. This may aid in identification of the at least one image artifact origin. In some instances the motion likelihood map could also be used to provide trial locations for registering the set of affected voxels to the preliminary image. This may help in further accelerating the numerical method.

In another embodiment the extended SENSE equation comprises an extended coil sensitivity matrix. The extended coil sensitivity matrix is chosen to minimize a contribution from at least a portion of the at least one image artifact origin.

This may be performed in different ways. In one example the motion likelihood map alone may be used to identify regions which are included in the extended SENSE reconstruction. In one concrete example the preliminary image may be reconstructed and then the anatomical model is registered to the preliminary image. The motion likelihood map is then also therefore registered to the preliminary image. Regions above a particular value or threshold within the motion likelihood map are then identified as regions or voxels within the preliminary image which are likely to be causing motion artifacts. The artifact-contribution of these regions may then be suppressed by adding the sensitivities of these locations to the extended coil sensitivity matrix.

In another embodiment the preliminary image comprises a survey scan image. The use of a survey scan image may be beneficial in some instances. For example the survey scan image could be acquired using a body coil or body antenna instead of performing the SENSE reconstruction. The survey scan image may be less likely to have image artifacts within it. This may be useful in registering the anatomical model.

In another embodiment the at least one image artifact is two-dimensional or three-dimensional. This may be beneficial because for example the method detailed in Winkelmann et al is so numerically intensive that it may be difficult to correct for two-dimensional or three-dimensional regions causing motion artifacts.

In another aspect the invention provides for a computer program product comprising machine-executable instructions for execution by a processor controlling a magnetic resonance imaging system. The magnetic resonance imaging system comprises a radio-frequency system for acquiring magnetic resonance data from an imaging zone. The radio-frequency system comprises multiple antenna elements. Execution of the machine-executable instructions causes the processor to control the magnetic resonance imaging system with pulse sequence commands to acquire the magnetic resonance data. The pulse sequence commands cause the processor to acquire magnetic resonance data from the multiple antenna elements according to a SENSE protocol. Execution of the machine-executable instructions further causes the processor to reconstruct a preliminary image using the magnetic resonance imaging data. Execution of the machine-executable instructions further causes the processor to calculate a fit or registration between an anatomical model and the preliminary image.

The anatomical model comprises a motion likelihood map. Execution of the machine-executable instructions further causes the processor to identify at least one image artifact origin at least partially using the motion likelihood map and the fit or registration. Execution of the machine-executable instructions further causes the processor to determine an extended SENSE equation at least partially using the at least one image artifact origin. Execution of the machine-executable instructions further cause the processor to construct a corrected SENSE image using the extended SENSE equation. The advantages of this have been previously discussed.

In another aspect the invention provides for a method of operating a magnetic resonance imaging system. The magnetic resonance imaging system comprises a radio-frequency system for acquiring magnetic resonance data from an imaging zone. The radio-frequency system comprises multiple antenna elements. The method comprises the step of controlling the magnetic resonance imaging system with the pulse sequence commands to acquire the magnetic resonance data. The pulse sequence commands cause the processor to acquire magnetic resonance data from the multiple antenna elements according to a SENSE protocol. The method further comprises the step of reconstructing a preliminary image using the magnetic resonance imaging data.

The method further comprises the step of calculating a fit or registration between an anatomical model and the preliminary image. The anatomical model comprises a motion likelihood map. The method further comprises the step of identifying at least one image artifact origin at least partially using the motion likelihood map and the fit or registration. The method further comprises the step of determining an extended SENSE equation at least partially using the at least one image artifact origin. The method further comprises the step of constructing a corrected SENSE image at least partially using the extended SENSE equation.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
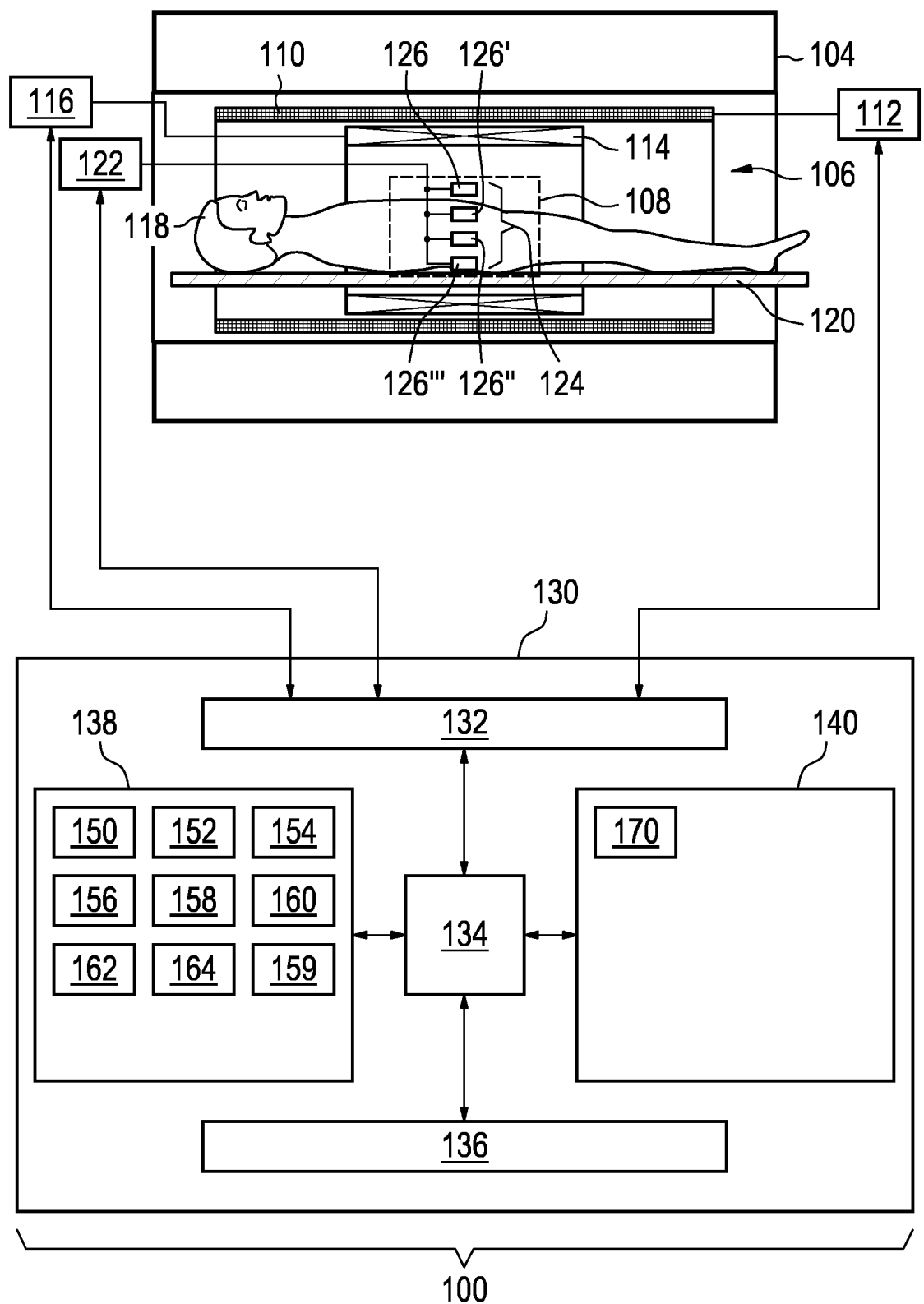
FIG. 1 illustrates an example of a magnetic resonance imaging system.

FIG. 1 shows an example of a magnetic resonance imaging system 100 with a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Within the bore 106 of the magnet 104 is an optional body coil 114. The body coil 114 may also be referred to as a body antenna. The body coil 114 is shown as being connected to a transceiver 116. In some embodiments body coil 114 may also be connected to a whole body coil radio frequency amplifier and/or receiver, however this is not shown in this example. If both a transmitter and a receiver are connected to the whole body coil 114, a means for switching between the transmit and receive mode may be provided. For example a circuit with a pin diode may be used to select the transmit or receive mode. A subject support 120 supports a subject 118 within the imaging zone.

A transceiver 122 is shown as being connected to a magnetic resonance imaging antenna 124. In this example the magnetic resonance imaging coil 124 is a surface coil comprising multiple antenna elements 126, 126', 126", 126'". The transceiver 122 is operable for sending and receiving individual RF signals to the individual coil elements 126, 126', 126", 126'". In this example the transceiver 116 and the transceiver 122 are shown as being separate units. However, in other examples the units 116 and 122 could be combined.

The magnetic resonance imaging system comprises a computer system 130. The transceiver 116, the transceiver 122, and the magnetic field gradient coil power supply are shown as being connected to a hardware interface 132 of the computer 130. The computer 130 is further shown as containing a processor 134 which is operable for executing the machine-readable instructions. The computer 130 is further shown as comprising a user interface 136, computer storage 138 and computer memory 140 which are all accessible and connected to the processor 134.

The computer memory 138 is shown as containing pulse sequence commands 150. The pulse sequence commands contain instructions which enable the processor 134 to control the magnetic resonance imaging system 100 to acquire magnetic resonance data 152 according to a SENSE protocol. The pulse sequence commands may contain instructions which enable the processor 134 to acquire magnetic resonance data according to more than one imaging protocol. The pulse sequence commands 150 enable the processor 134 to acquire data according to a SENSE protocol but it may also enable other protocols to be used such as acquiring a survey or scout scan before performing the SENSE protocol. The computer storage 138 is shown as containing magnetic resonance data 152 which was acquired using the pulse sequence commands 150 to control the acquisition.

The computer storage 138 is further shown as containing a preliminary image 154 that was reconstructed from the magnetic resonance data 152. The computer storage 138 is further shown as containing an anatomical model 156 which can be fit or registered to the preliminary image 154. The computer storage 138 is further shown as containing a motion likelihood map 158 that is registered or is part of the anatomical model 156. The computer storage 138 is further shown as containing a fit 159 or registration that was calculated between the preliminary image 154 and the anatomical model 156. The computer storage 138 is further shown as containing a location of an image artifact origin 160 that was identified in the preliminary image 154. The location of the image artifact origin 160 is referenced to a location or set of locations in the preliminary image 154. If the magnetic resonance imaging system 100 is properly calibrated then the location of the image artifact origin 160 may also be stored in terms of coordinates relative to the subject 118.

The computer storage 138 is further shown as containing an extended SENSE equation 162. The extended SENSE equation contains one or more additional columns in its sensitivity matrix that are used to minimize sensitivity of the reconstruction-result to motion at the location of the image artifact origin. The computer storage 138 is further shown as containing a corrected SENSE image 164. The computer memory 140 is shown as having machine-executable instructions 170. The machine-executable instructions 170 contain instructions which enable the processor 134 to control the operation of the magnetic resonance imaging system 100 and also to perform image reconstruction and modifications of magnetic resonance data and magnetic resonance images. The machine-executable instructions 170 may cause the processor 134 to perform a computer implemented method as is described in any one of the following method flowcharts.

Figure 2:
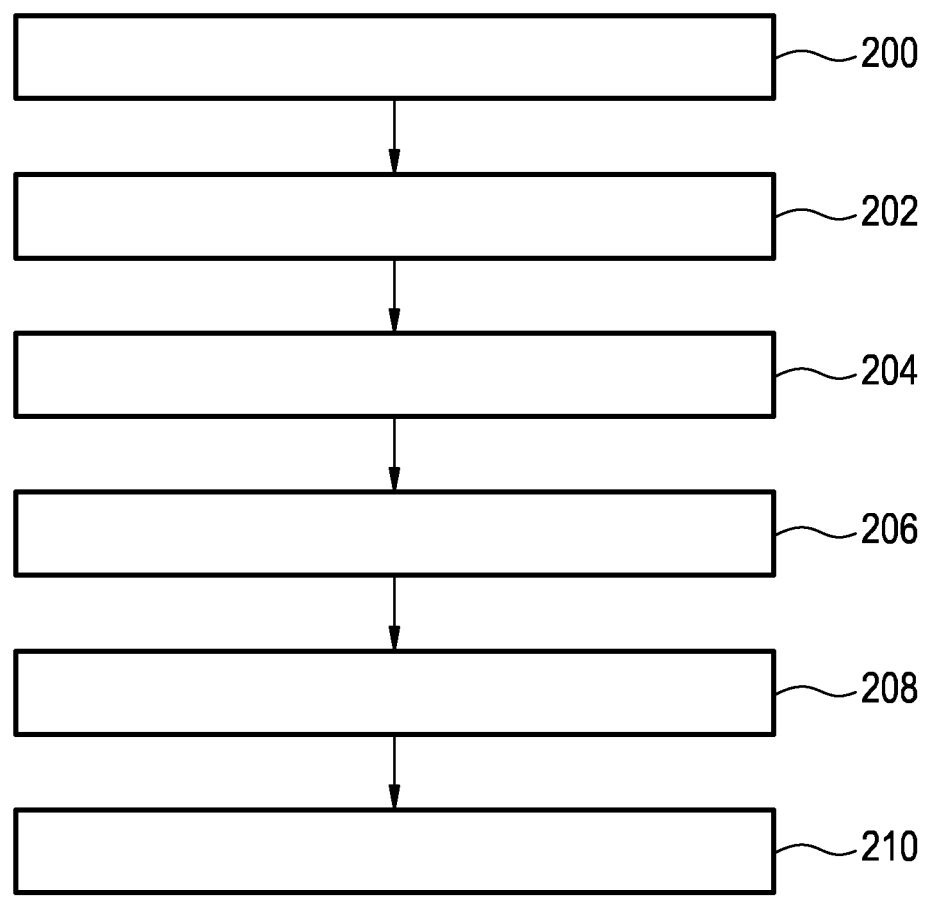
FIG. 2 shows a flow chart which illustrates a method of operating the magnetic resonance imaging system of FIG. 1.

FIG. 2 shows a flowchart which illustrates a method of operating the magnetic resonance imaging system 100 of FIG. 1. The following method steps could be implemented by the machine-executable instructions 170 shown in FIG. 1.

First in step 200 the magnetic resonance imaging system is controlled with the pulse sequence commands 150 to acquire the magnetic resonance data 152. Next in step 202 a preliminary image 154 is reconstructed from the magnetic resonance data 152. Next in step 204 a fit or registration between an anatomical model 156 and the preliminary image 154 is calculated. The anatomical model 156 comprises a motion likelihood map 158. In step 206 at least one image artifact origin 160 is identified at least partially using the motion likelihood map 158 and the fit or registration 159. Next in step 208 an extended equation 162 is constructed at least partially using knowledge of the at least one image artifact origin 160. Finally in step 210 a corrected SENSE image 164 is constructed according to the extended SENSE equation 162.

In one variation, the extended SENSE equation is constructed by adding one or more additional columns to the coils sensitivity matrix to construct an extended coil sensitivity matrix. The extended coil sensitivity matrix is chosen to minimize a contribution from at least a portion of the at least one image artifact origin.

Figure 3:
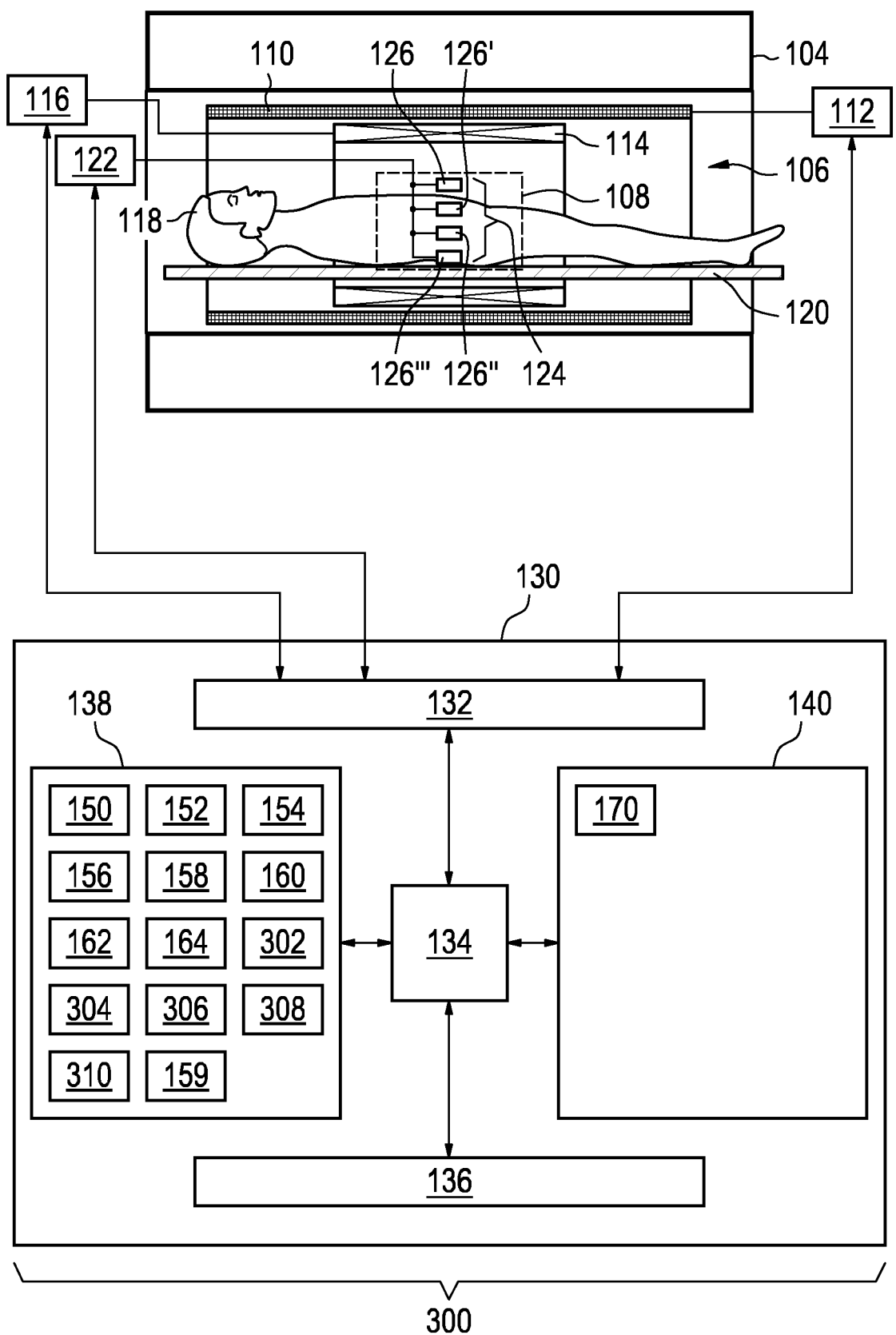
FIG. 3 illustrates a further example of a magnetic resonance imaging system.

FIG. 3 shows a further example of a magnetic resonance imaging system 300. The system 300 is similar to the system 100 shown in FIG. 1. The computer storage 138 is further shown as containing measured coil images 302 that were reconstructed from the magnetic resonance data 152. The computer storage 138 further shows a preliminary SENSE image 304 that was constructed using the measured coil images 302 and the set of coil sensitivities 306 which are shown as being stored in the computer memory 138. The set of coil sensitivities 306 could be known a priori or they may be measured during a SENSE calibration step. For example a survey image could be acquired using the body coil and be used to calibrate each of the antenna elements 126, 126', 126", 126'".

The computer storage 138 is further shown as containing back projected images 308 that were calculated from the preliminary SENSE image 304 and the set of coil sensitivities 306. The back projected images 308 are used to create images that show what the measured coil images 302 would be like if the set of coil sensitivities 306 were perfectly known and also there were no image artifacts. The back projected images 308 are however different from the measured coil images 302. Comparing the measured coil image and the back projected image for each of the coil elements 126, 126', 126", 126'" a set of affected voxels 310 can be identified for each coil. These may be used to identify image artifacts within the measured coil images. These also may lead to the identification of image artifacts within the preliminary SENSE image 304. The computer memory 140 is again showing the machine-executable instructions 170. The machine-executable instructions could for instance cause the processor 134 to perform a computer-implemented method as described in FIG. 2 or also in the following FIG. 4.

Figure 4:
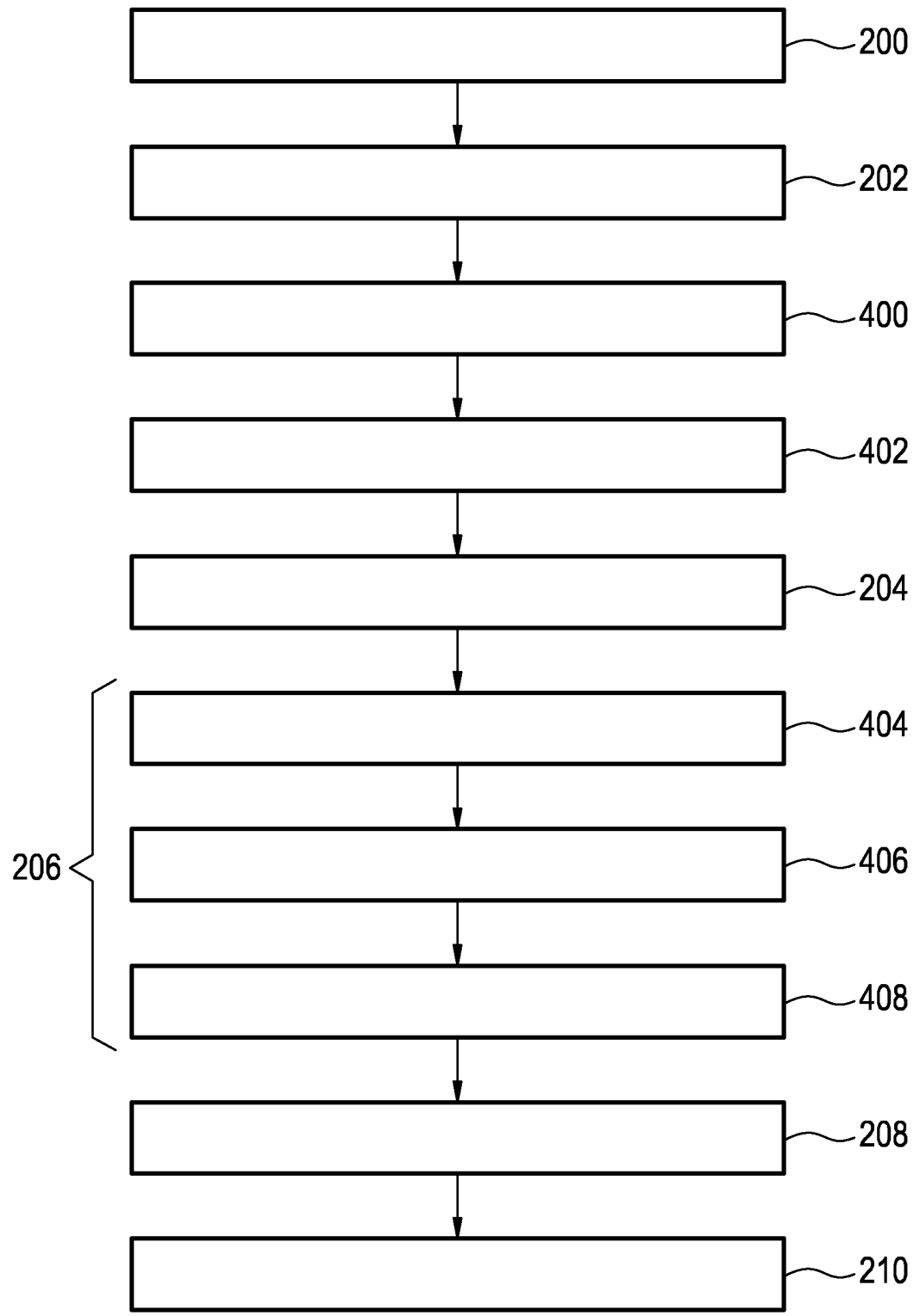
FIG. 4 shows a flow chart which illustrates a method of operating the magnetic resonance imaging system of FIG. 3.

FIG. 4 shows a flow diagram which illustrates a method similar to that illustrated in FIG. 2. In FIG. 4 a number of additional steps have been added to the method. FIG. 4 starts with steps 200 and 202 as are described in FIG. 2. Next in step 400 a measured coil image is reconstructed for each of the multiple antenna elements 126, 126', 126", 126'" using the magnetic resonance data 152. Next in step 402 a preliminary SENSE image 304 is constructed by using the set of coil sensitivities 306 to combine the measured coil image 302 for each of the multiple antenna elements 126, 126', 126", 126'" according to a SENSE magnetic resonance imaging protocol. In some examples the preliminary SENSE image 304 may be the preliminary image 154. In this case step 204 is now performed because step 204 is identical with steps 400 and 402.

In other examples however the preliminary image is different or distinct from the preliminary SENSE image 304. For example the pulse sequence commands 150 could cause the magnetic resonance imaging system 100 to acquire a survey or scout scan and this may then be fit to the anatomical model. In yet other examples the survey or scout scan image and also the preliminary SENSE image are both used for fitting to an anatomical model while performing the computer implemented method.

As described above the method then may optionally perform step 204. In the method shown in FIG. 4 steps 404, 406, 408 are more detailed instructions on how step 206 of FIG. 2 is performed. First in step 404 a back projected image for each of the multiple antenna elements 126, 126', 126", 126'" is constructed using the preliminary SENSE image 304 and the set of coil sensitivities 306. Next in step 406 the back projected image 308 is compared to the measured coil image 302 for each of the multiple antenna elements 126, 126', 126", 126'" to identify a set of affected voxels 310. The identification of the at least one image artifact origin is then performed at least partially using the set of affected voxels 310 and the motion likelihood map 158 and the fit or registration 159. Next in step 308 the at least one image artifact origin 160 is corrected by numerically searching for a maximum of the consistency measure within a predetermined vicinity of each of the at least one image artifact origin before constructing the corrected SENSE image 164.

For example the numerical method described in Winkelmann et. al. could be applied where the search area is limited to the predetermined vicinity for a particular voxel. In this case the algorithm of Winkelmann et all is applied but the search area has been greatly reduced using processing in image space. This may lead to a dramatic increase in the numerical efficiency in finding the at least one image artifact origin. After the steps 404, 406, and 408 may be repeated numerically during the process of searching for a maximum of a consistency measure. Next steps 208 and 210 are performed as is described in FIG. 2.

SENSE is one of the techniques to accelerate Magnetic Resonance (MR) data acquisition. To facilitate the unfolding, coil sensitivity information and measured data have to be available as the essential inputs for the SENSE algorithm. If coil sensitivities are perfect, SENSE image artifacts might still appear due to errors in the measured data. The most prominent artifact of this kind, caused by a distortion of the Fourier encoding process, is ghosting, resulting in a displaced appearance of parts of the actual signal. However, although the Fourier encoding process is spoiled the actual signal is properly sensitivity encoded which gives a handle to identify and to remove the ghosting structures, see the Winkelmann et. al. paper.

Key of this idea is to identify signal at risk by a consistency check and to solve an extended SENSE problem including a displaced signal component (the ghost) for which the right origin has to be found in a search procedure performed along the phase encoding direction. The numerical burden of this search might be feasible in 1D undersampling but gets problematic in two dimensions and could run into false minima in some poor cases. In some examples, the idea is to incorporate an appropriate, patient-adapted body model into the extended SENSE reconstruction to accelerate and stabilize the search for the ghost origin by incorporating specific prior knowledge. Based on 3D scout MRI data (or other images), acquired at the beginning of the examination, an appropriate body model (or anatomical model) can be adapted to the patient. The model may contain annotated organs (i.e., liver, lung, etc.) and structures like vessels, fluid-filled chambers (heart, etc.), chest-wall and so on which have a high probability to be the origin of MR ghosts (e.g. due to inflow, flow, motion effects, etc. . . . ). This model adapted to the folded SENSE/consistency data can guide the ghost origin search procedure decreasing the numerical effort and increasing confidence.

SENSE is the method for parallel imaging. If coil sensitivity information is perfect, SENSE image quality depends still on the measured data. Those can contain some data inconsistencies e.g. caused by motion like bulk motion, flow and fresh magnetization in-flow, etc. which actually can spoil the Fourier encoding process. Ghosting, apart from blurring, is the most prominent image artifact, which can't be resolved by a standard SENSE reconstruction.

However, it was found that the ghost, although shifted in the phase encoding direction (due to a corrupted Fourier encoding process) in the final SENSE image, is properly sensitivity encoded. However, its actual location, the spot where it came from, is unknown (1). Voxels corrupted by ghosting signals can therefore be found in the reconstructed SENSE image by analyzing the consistency between the reconstructed SENSE image and the underlying folded data (1). The consistency test shows the ghost because it was exposed to a different receive coil sensitivity during signal detection compared to what has been assumed during SENSE reconstruction.

To remove the ghost for those corrupted voxels an extended SENSE problem must be formulated asking for an additional signal contribution; the ghost—stemming from another location, folding onto the corrupted voxel. The resulting signal model differs from that of normal SENSE by the additional term, $S_{i,g} \delta$, in Eq. [1] of Winkelmann et. al.

$$C_i = \Sigma S_{i,j} \rho_j + S_{i,g} \delta \qquad [1]$$

Here the vector C contains the measured folded coil signals for the coil i, the measurement data. S is denoting the sensitivity matrix, $\rho$ is the vector containing the actual voxel signals to be obtained, $\delta$ is the ghost signal contribution coming from the unknown location g while the sum run over all coils. This extended SENSE problem can only be established if the SENSE problem is over determined. Having one phase encoding direction (2D imaging) increases the rank of the extended SENSE matrix by one (only one ghost is expected) having two directions like in 3D imaging could result in two ghosting sources, increasing the rank of the extended SENSE matrix even further, with the consequence to reduce the condition number of the pseudo inverse making solution prone to noise. The extended SENSE problem is key element of an optimization to obtain best data consistency (firming as a penalty term) with respect the potential location g of the ghost. This search might be feasible in 1D under-sampling (see FIG. 3a of Winkelmann et. al.) but gets problematic in two dimensions and could run into false minima in some poor cases.

In FIG. 3a of Winkelmann et. al. a one-dimensional search along the phase encoding direction for a ghosting artifact is 2D imaging. The consistency log(P) of the extended SENSE reconstruction plotted as a function of the potential origin of the ghost δ along the phase encoding direction. Two different ghosting voxels in the final SENSE image are shown (I, II). At the ghost appearance (LAA—location of artifact appearance in the final image) the problem is singular at the ghost origin (LAO—location of artifact origin) the consistency shows a maximum. For ghost (I) the main maximum is roughly well defined, for ghost (II) the problem might be harder.

Furthermore, the condition of the inverse of Eq. [1] gets poor if the origin of the artifact g is close to the location I of the voxel under study making the extended SENSE solution more difficult.

To speed up and to stabilize the solving process of the extended SENSE problem Eq. [1] it is proposed to incorporate prior knowledge. This is realized by using an appropriate, patient-adapted body model in the extended SENSE reconstruction. This model indicates potential regions at risk to be a source of ghosting artifacts helping to guide the search and to rule out potential false positives.

Based on the 3D scout MRI data, acquired at the beginning of the examination, the body model can be adapted patient specifically, reflecting major features of the patient's anatomy and geometry appropriately. The model contains annotated organs (liver, lung, etc.) and structures (like vessels, fluid-filled chambers (the heart, etc.), chest-wall, etc.) which have a high probability to be the origin of MR ghosts (e.g. due to inflow, flow, motion effects, etc.).

Models can be adapted to the extended SENSE/consistency data, can guide the ghost origin search procedure decreasing the numerical effort and increase confidence.

Furthermore, the adapted body model might be helpful to guide the SENSE signal model also in other directions. Based on the adapted body model, areas in the coil sensitivity maps can be identified which are at risk to be wrong. These areas can also be added as columns to the sensitivity matrix, further extending the sensitivity matrix.

In one example, a liver examination is performed on a subject or patient. The liver is surrounded by a corresponding multi-element reception coil, is placed in the iso-center of the magnet. A multi-slice or 3D low resolution scout scan or other scan is measured for planning purposes. The data are further send to an image-processing algorithm that fits a predefined and body model of the corresponding body region to the data using elastic registration. The identification of the coarse body region could be done automatically or could be context driven. After the registration process the patient geometry is matched to the information about the risk for motion artifacts and their nature. This information will become available for each voxel within the patient and will be accessible for all algorithms to be performed subsequently.

Coil sensitivity information is obtained using a SENSE reference scan. Using the receiver array a 3D breath-hold (15-20 sec.) diagnostic liver scan is performed covering the entire abdominal region. Due to cardiac motion fresh blood is pumped into the 3D volume, scanned, resulting due in-flow effects into an intensity modulation of the MR signal causing a Fourier ghosting artifact in the sub-sampled SENSE imaging. This artifact also propagates during SENSE reconstruction into the entire FOV.

This artifact is identified by the consistency check proposed in Winkelmann et. al. This check measures how the measured, sub-sampled reduced FOV images fit the finally SENSE reconstructed images.

To facilitate this comparison the final SENSE image is back-projected onto the individual reduced FOV coil images for each channel; their difference to the measured data has to match the receiver noise level and is evaluated using an appropriate probability (see Winkelmann et. al.). Not matching allows identification of corrupted voxels that need a different solution to the SENSE problem employing the extended SENSE approach (see Winkelmann et. al.). Here the geometrically matched model comes into play, briefly illustrated in FIG. 5 below, which supports/guides the search along the corresponding phase encoding direction, performed to find the origin of the ghost. Thus, the extended SENSE approach is augmented by the annotated body model which informs the algorithm about which pixels in the full Field of View (FOV) or in the respective sub-sampled FOV are potential sources of artifacts. Those and their neighborhood will be tested regarding the achievable consistency assuming that they are the source. Furthermore, the information from the model can be used the additionally regularize potential others solutions (locations) to avoid false solutions.

This approach speeds up the algorithm and can be used to avoid noise break though or false positives.

Figure 5:
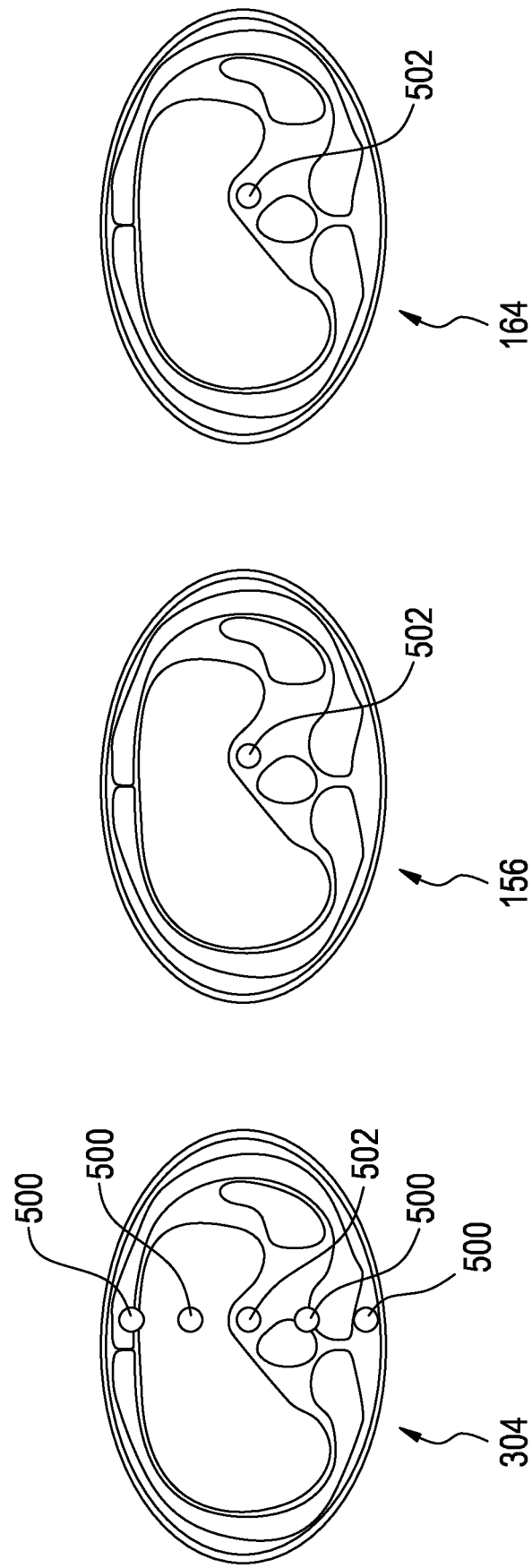
FIG. 5 illustrates the Scheme of an annotated body model guided extended SENSE reconstruction.

FIG. 5 shows an idealized representation of a preliminary SENSE image 304, an anatomical model 156, and a corrected SENSE image 164. The preliminary SENSE image 304 shows a cross-section of a subject and there are a number of ghost artifacts 500 of an aorta 502. The movement of blood within the aorta 502 causes the ghost artifacts 500. The anatomical model 156 may have a motion likelihood map 158 assigned to it. In this map the aorta 502 is identified as a region which has a high likelihood of causing a ghosting artifact. This model 156 is then fit to the preliminary SENSE image 304 and the method as described in FIGS. 3 and 4 is applied to calculate the corrected SENSE image 164. FIG. 5 illustrates the Scheme of an annotated body model guided extended SENSE reconstruction. The SENSE reconstructed MR image shows ghosting artifacts (replica of the pulsating aorta in phase encoding direction, vertical) which are identified by the consistency check. The geometrically matched, adapted body model (middle) shows the potential origin of this ghosting artifact (aorta—high risk area highlighted in red). This information is used to guide the search of the extended SENSE reconstruction removing the artifacts schematically shown (right).

Such a model can furthermore serve many other purposes, for example:
 Organ specific planning
 Automatic navigator positioning
 Automatic shim volume positioning
 Automatic outer-volume suppression (REST-slab) positioning.

In MRI, it can frequently happen that a region that is not of clinical interest disseminates artifacts over clinically interesting regions. One typical example is the aorta that disseminates flow-artifacts onto the liver; another one is the breast or the heart, which, by motion, may cause artifacts over the spine. For an example, see FIG. 6 below. It schematically shows a sagittal view through the human body, containing a spine that is of clinical interest and a heart that is not of interest in that study.

Figure 6:
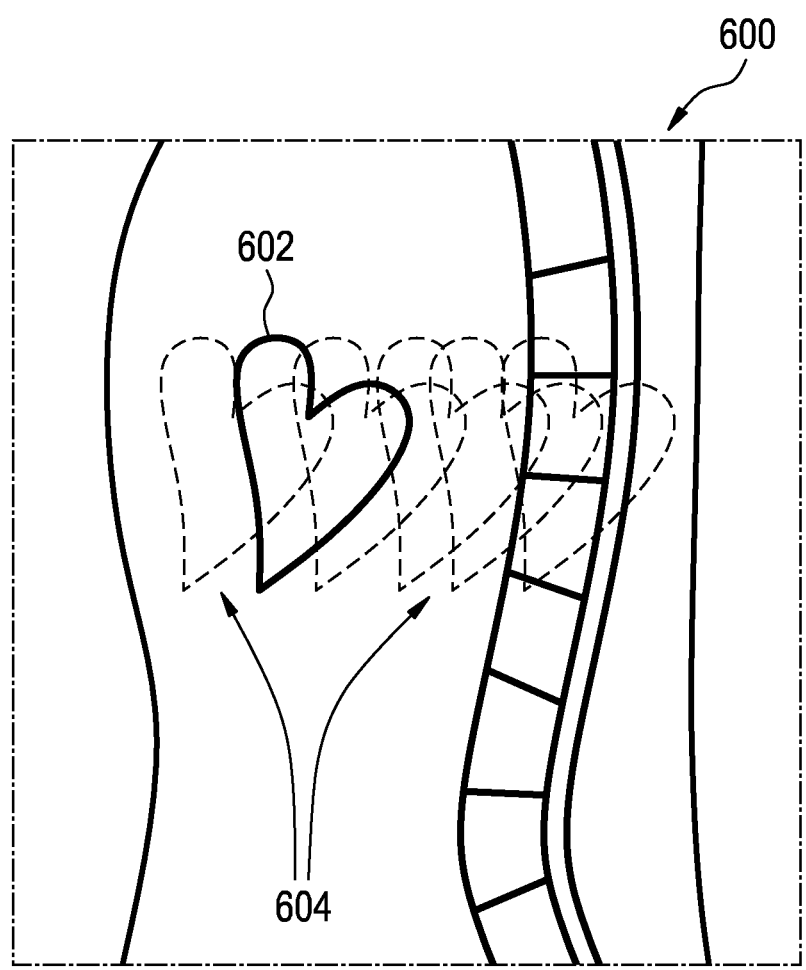
FIG. 6 diagrammatically illustrates the effect of motion in a magnetic resonance image.

FIG. 6 shows a sagittal view 600 showing the heart 602. As the heart is moving it causes image artifacts 604 or ghosting images of the heart 602.

In some cases, the problem can be overcome by positioning so-called REST (for "Regional Saturation Technique") over the problematic (usually moving) body area. However, this often is bound to restrictions, e.g., regions other than straight slabs are usually impractical. It also can have serious drawbacks in terms of scan time, attainable repetition time etc.

With a large numbers of receive elements, this problem can be solved in a completely different way. The coil combination algorithm can be made such that the result, in combination, is minimally sensitive to an area that is known to cause trouble.

This could be done by the user indicating an area known for causing motion-artifacts. This has some similarity to the placement of REST-slabs, which is also planned by the user. As a difference, a motion-presence indication for the sake of optimal synergy-combination can be made before or after the actual measurement (assuming the raw data of the measurement is still kept in memory). For that reason, the technique is called "post-scan REST".

However, the necessity for user-input hampers workflow. It is therefore an aim of the present invention to apply the same principle, but interface-free.

Particularly in abdominal imaging, we assume that motion-artifacts are predominantly caused by the anterior subcutaneous fat of the patient. The idea is to detect that region and to devise, in the reconstruction process, a coil-combination algorithm that minimizes sensitivity to that region.

Figure 7:
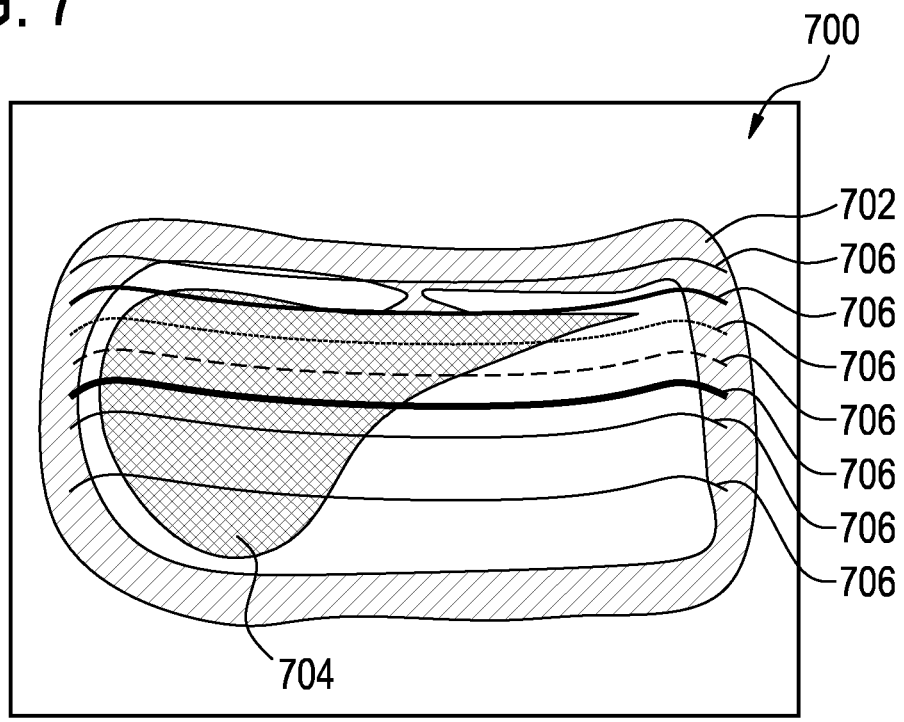
FIG. 7 further diagrammatically illustrates the effect of motion in a magnetic resonance image.

FIG. 7 shows a Fig. which represents an abdominal section MRI. The region labeled 702 represents fat. The region labeled 704 represents an organ of interest such as the liver. The various lines 706 represent image artifact or ghosting artifacts caused by movement of the fat layer 702.

In some examples the method applies to sagittal or axial abdominal imaging that is done with a multiplicity of receive antennas or antenna elements. In principle, the invention is compatible with all types of acquisition sequences and does not require modification thereof. The invention consists of a modified reconstruction 'regular' data.

One element of some examples is the detection of the anterior edge of the anterior subcutaneous-fat region. This can be done by analyzing an initial reconstruction of the scan at hand, an image of the same region from a previous scan or a coil-reference scan or the like.

Optionally, an estimate of the thickness of the fat-layer can be provided by a low-resolution chemical shift imaging scan (such as water-fat separating scan; silicon-fat separating scan); alternatively, a 'typical' fat-layer thickness can be pre-programmed. Fully automated image segmentation, such as intensity-based or atlas-based segmentation, may also serve to generate the initial estimate of the object whose signal intensity is to be suppressed.

Given an initial estimate of the object, the most anterior object-part is considered as the 'problematic' fat-layer. The anterior edge combined with the thickness provides us with the region (a 2D region in a slice, or a 3D region in a multiplicity of slices.

Alternatively, we can determine the position of a curve (in multi-slice or 3D: a plane) representing the center of the anterior-fat region.

Given that region, or the center plane, we can devise a reconstruction that minimizes sensitivity to that region. This is done by choosing, for each pixel to be reconstructed, the most appropriate coil-element weighting that is insensitive to the region of the anterior fat area.

Figure 8:
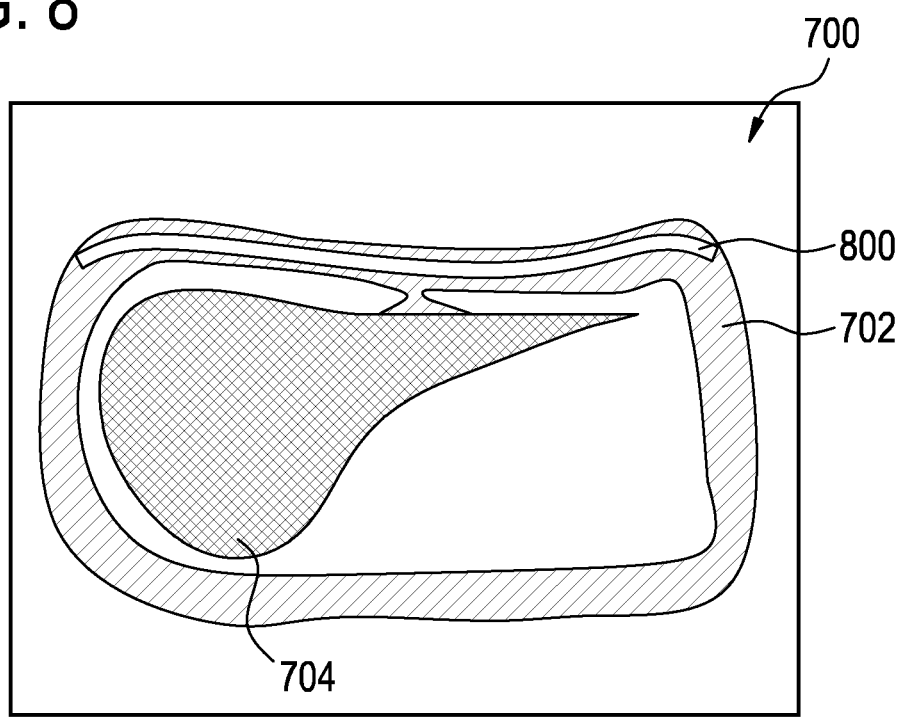
FIG. 8 diagrammatically illustrates the choosing of a region which is minimized during an extended SENSE reconstruction to reduce motion artifacts.

FIG. 8 is similar to that shown in FIG. 7. In this schematic of an MRI the abdominal section 700 is shown again. In this case there is a region 800 which the combination of coil element weights is made insensitive. This eliminates the image artifacts 706 or ghosting artifacts shown in FIG. 7.

In some examples, reconstruction algorithm comprises appending, to the coil sensitivity matrix S an extra row $s_a$ (or a multiplicity of rows $s_{a1}, \ldots s_{ak}, \ldots s_{aK}$, where k runs over all identified locations where motion-artefacts may originate). This leads to an "extended coil sensitivity matrix" $S_E = [S \; s_a]$ (or, alternatively, $S_E = [S \; s_{a1} \ldots s_{ak} \ldots s_{aK}]$). With this matrix, a regular solution to the SENSE-problem can be applied, i.e.:

$$p_E = (S_E^h \Psi^{-1} S_E + R_E^{-1}) S_E^h \Psi^{-1} m.$$

Except for the subscript 'E', this looks like a very familiar SENSE-equation, with p representing a resulting set of pixels, $\Psi$ the noise covariance between acquisition channels, R the regularization matrix and m the measured coil-array data. Yet, both p and R now contain one (or a series of) extra elements. In this invention, the SENSE equation is not producing an equidistant set of unfolded pixels, but the 'regular' equidistant set plus an estimate of the pixel-intensity on the location of the artefact-source (i.e. the anterior fat rim); within the scope of this invention, that extra result is regarded as uninteresting.

Similarly, a difference between a 'regular' regularization matrix R and the "$R_E$", is that the latter also has to indicate the expected signal level at the location of the anterior fat—which is equally well known as the other diagonal elements of the matrix R.

Figure 9:
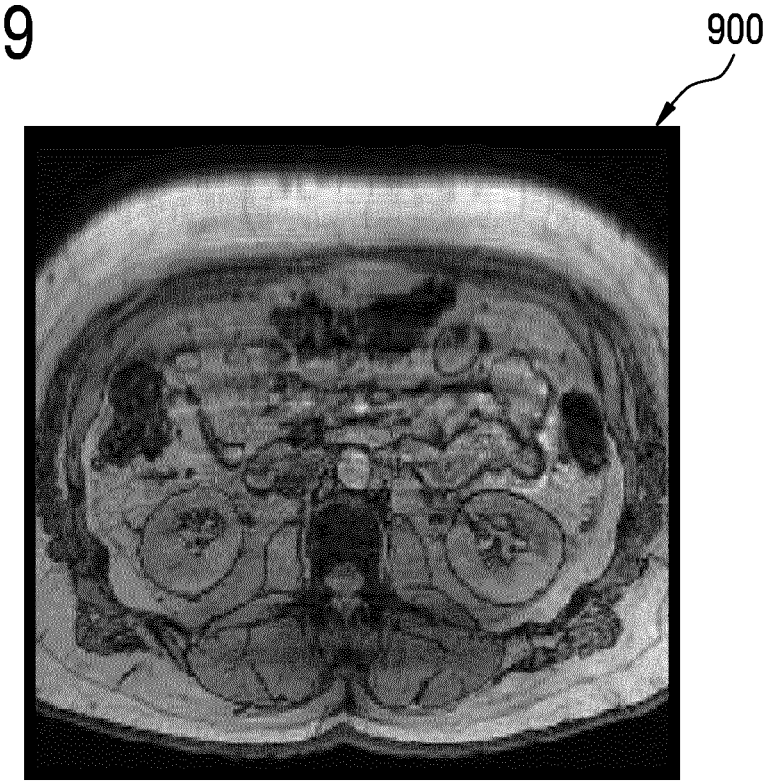
FIG. 9 shows a magnetic resonance image that has been modified to simulate motion in a fat layer.
Figure 10:
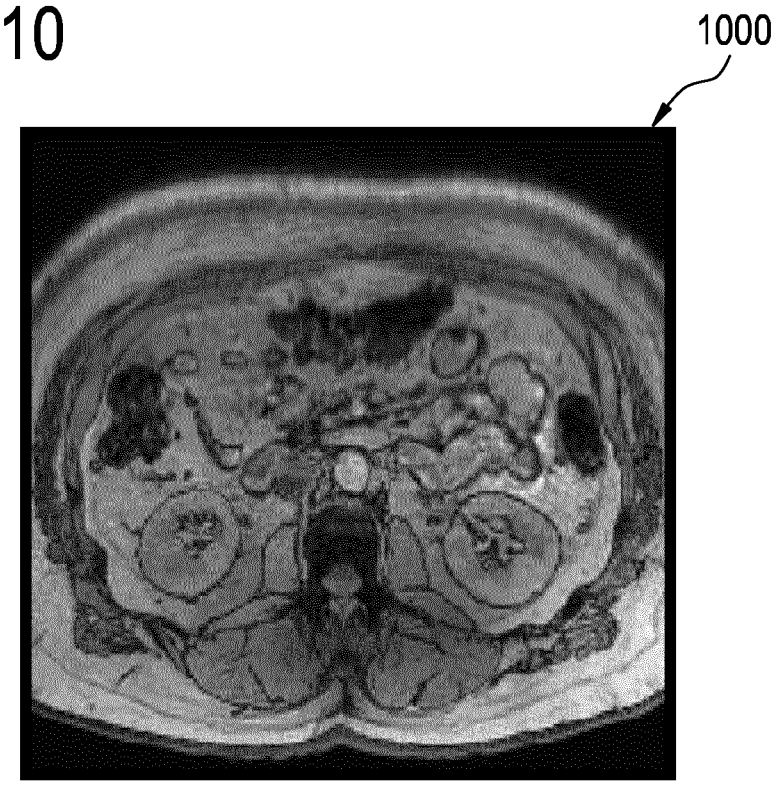
FIG. 10 shows a simulation of removing motion artifacts from the image shown in FIG. 9.

FIGS. 9 and 10 show magnetic resonance images 900 and 1000. FIG. 9 shows a magnetic resonance image 900 where simulated motion artifacts have been added to the image.

FIG. 10 shows a magnetic resonance image 1000 where a region of coil weight elements was made insensitive to remove the artificial motion artifacts of the image 900.

In the following description, "Possup" is used as shorthand for "Post-scan sensitivity suppression to anterior fat layer". In essence, the idea is to slightly alter the SENSE reconstruction in such a way that the resulting antenna element combination is minimally sensitive to an (automatically detected) region of the patient, e.g., the anterior subcutaneous fat region in abdominal imaging.

A breathhold-image of the abdomen was taken as a starting point. That image showed relatively little "natural" motion artifacts. Subsequently, four coil sensitivity maps were conceived, decaying as 1/x from the anterior edge, the right edge, the posterior edge and the right edge of the image.

Motion was simulated by creating 6 different 'distorted' images. Each distortion left the posterior half of the object unaffected, but stretched the anterior half such that the upper edge of the object was moved anteriorly by 1, 2, 3, 4, 5 or 6 pixels. (The object is approximately 200 pixels in size, so the anterior half is approximately 100 pixels, which means that the biggest distortion stretched the anterior half by approximately 6%). The distorted image is shown in FIG. 9.

All these sets were Fourier-transformed to k-space, and each ky-line of the simulation was randomly picked from one of these six sets.

Reconstructing Aforementioned Simulation with CLEAR Results in the Image to the Right—

Using this image as a first iteration, the anterior edge of the object was detected. Subsequently, two regions parallel to that anterior edge were defined: one at a depth of 5 pixels (anteriorly) and one at a depth of 12 mm. The knowledge of the thickness of the fat layer was manually entered. This delivers two curves F1(x) and F2(x).

The Possup reconstruction calculates, for each location (x,y), a coil-element weighting that is minimally sensitive to regions F1(x) and F2(x), while maximizing sensitivity to (x,y). It subsequently combines coil element data.

Not unexpectedly, the anterior-fat region gets suppressed in-between 5 and 12 pixels of depth. Mathematically, this consists of extending the SENSE coil-sensitivity matrix with two extra columns. This is relevant here, because it allows an easy combination with SENSE. By applying Possup, also this artifact is largely removed as is shown in FIG. 10.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
110 magnetic field gradient coils
112 magnetic field gradient coil power supply
114 body coil or body antenna
116 transceiver
118 subject
120 subject support
122 transceiver
124 magnetic resonance image antenna
126 antenna element
126' antenna element
126" antenna element
126'" antenna element
130 computer
132 hardware interface
134 processor
136 user interface
138 computer storage
140 computer memory
150 pulse sequence commands
152 magnetic resonance data
154 preliminary image
156 anatomical model
158 motion likelihood map
159 fit or registration
160 location of image artifact origin
162 extended SENSE equation
164 corrected SENSE image
170 machine executable instructions
200 controlling the magnetic resonance imaging system with pulse sequence commands to acquire the magnetic resonance data
202 reconstructing a preliminary image using the magnetic resonance imaging data
204 calculating a fit or registration between an anatomical model and the preliminary image, wherein the anatomical model comprises a motion likelihood map
206 identifying at least one image artifact origin at least partially using the motion likelihood map and the fit or registration
208 determining an extended SENSE equation at least partially using at least one image artifact origin
210 constructing a corrected SENSE image according to an extended SENSE reconstruction at least partially using the extended SENSE equation
300 magnetic resonance imaging system
302 measured coil images
304 preliminary SENSE image
306 set of coil sensitivities
308 back projected images
310 set of affected voxels
400 reconstructing a measured coil image for each of the multiple antenna elements using the magnetic resonance data
402 constructing a preliminary SENSE image by using a set of coil sensitivities to combine the measured coil image for each of the multiple antenna elements according to the SENSE protocol
404 constructing a backprojected image for each of the multiple antenna elements using the preliminary SENSE image and the coil sensitivities
406 comparing the backprojected image to the measured coil image for each of the multiple antenna elements to identify a set affected voxels for each of the multiple antenna elements
408 numerically searching for a maximum of a consistency measure within a predetermined vicinity of each of the at least one image artifact origin before constructing the corrected SENSE image to correct the at least one image artifact origin
500 ghost artifact
502 aorta
600 sagittal view
602 heart
604 image artifacts
700 abdominal section
702 fat
704 organ of interest
706 image artifacts
800 region
900 magnetic resonance image
1000 magnetic resonance image

The invention claimed is:

1. A magnetic resonance imaging system comprising:
   a radio-frequency system for acquiring magnetic resonance data from an imaging zone, wherein the radio-frequency system comprises multiple antenna elements;
   a memory containing machine executable instructions and pulse sequence commands, wherein the pulse sequence commands cause the processor to acquire magnetic resonance data from the multiple antenna elements according to a SENSE protocol;
   a processor, wherein execution of the machine executable instructions causes the processor to:
      control the magnetic resonance imaging system with the pulse sequence commands to acquire the magnetic resonance data;
      reconstruct a preliminary image using the magnetic resonance imaging data;
      calculate a fit between an anatomical model and the preliminary image, wherein the anatomical model comprises a motion likelihood map;
      identify at least one image artifact origin at least partially using the motion likelihood map and the fit;
      determine an extended SENSE equation at least partially using at least one image artifact origin; and
      construct a corrected SENSE image using the extended SENSE equation.

2. The magnetic resonance imaging system of claim 1, wherein execution of the machine executable instructions causes the processor to:
   reconstruct a measured coil image for each of the multiple antenna elements using the magnetic resonance data;
   construct by using a set of coil sensitivities to combine the measured coil image of each of the multiple antenna elements according to the SENSE protocol.

3. The magnetic resonance imaging of claim 2, wherein the preliminary image comprises the preliminary SENSE image.

4. The magnetic resonance imaging system of claim 2 wherein execution of the machine executable instructions further causes the processor to:
   construct a backprojected image for each of the multiple antenna elements using the preliminary SENSE image and the coil sensitivities; and
   compare the backprojected image to the measured coil image for each of the multiple antenna elements to identify a set of affected voxels for each of the multiple antenna elements;
   wherein the identification of the at least one image artifact origin is performed in image space;
   wherein the identification of the at least one image artifact origin is performed at least partially using the set of affected voxels at least partially using the motion likelihood map and the fit.

5. The magnetic resonance imaging system of claim 4, wherein the at least one image artifact origin is corrected by numerically searching for a maximum of a consistency measure within a predetermined vicinity of each of the at least one image artifact origin before constructing the corrected SENSE image, wherein the consistency measure is dependent upon the difference between the set of affected voxels in the preliminary SENSE image and backprojected trial SENSE images for each of the multiple antenna elements, wherein the backprojected trial sense images are constructed from a trial SENSE image, wherein the trial sense image is constructed using a trial SENSE equation.

6. The magnetic resonance imaging system of claim 5, wherein the trial SENSE equation that maximizes the consistency measure is the extended SENSE equation.

7. The magnetic resonance imaging system of claim 4, wherein execution of the machine executable instructions further causes the processor to modify the at least one image artifact origin by registering the set of affected voxels to the preliminary image.

8. The magnetic resonance imaging system of claim 1, wherein the extended SENSE equation is chosen to minimize a contribution from at least a portion of the at least one image artifact origin.

9. The magnetic resonance imaging system of claim 1, wherein the preliminary image comprises a survey scan image.

10. The magnetic resonance imaging system of claim 1, wherein the at least one image artifact origin is two-dimensional or three-dimensional.

11. A computer program product comprising machine executable instructions for execution by a processor controlling a magnetic resonance imaging system, wherein the magnetic resonance imaging system comprises a radio-frequency system for acquiring magnetic resonance data from an imaging zone, wherein the radio-frequency system comprises multiple antenna elements, wherein execution of the machine executable instructions causes the processor to:
   control the magnetic resonance imaging system with pulse sequence commands to acquire the magnetic resonance data, wherein the pulse sequence commands cause the processor to acquire magnetic resonance data from the multiple antenna elements according to a SENSE protocol;
   reconstruct a preliminary image using the magnetic resonance imaging data;
   calculate a fit between an anatomical model and the preliminary image, wherein the anatomical model comprises a motion likelihood map;
   identify at least one image artifact origin at least partially using the motion likelihood map and the fit;
   determine an extended SENSE equation at least partially using at least one image artifact origin; and
   construct a corrected SENSE image using the extended SENSE equation.

12. A method of operating a magnetic resonance imaging system, wherein the magnetic resonance imaging system comprises a radio-frequency system for acquiring magnetic resonance data from an imaging zone, wherein the radio-frequency system comprises multiple antenna elements, wherein the method comprises the steps of:
   controlling the magnetic resonance imaging system with pulse sequence commands to acquire the magnetic resonance data, wherein the pulse sequence commands cause the processor to acquire magnetic resonance data from the multiple antenna elements according to a SENSE protocol;
   reconstructing a preliminary image using the magnetic resonance imaging data;
   calculating a fit between an anatomical model and the preliminary image, wherein the anatomical model comprises a motion likelihood map;
   identifying at least one image artifact origin at least partially using the motion likelihood map and the fit;
   determining an extended SENSE equation at least partially using at least one image artifact origin; and
   constructing a corrected SENSE image using the SENSE equation.

13. The method of claim 12, wherein the method further comprises:
   reconstructing a measured coil image for each of the multiple antenna elements using the magnetic resonance data;
   constructing a preliminary SENSE image by using a set of coil sensitivities to combine the measured coil image for each of the multiple antenna elements according to the SENSE protocol;
   constructing a backprojected image for each of the multiple antenna elements using the preliminary SENSE image and the coil sensitivities; and
   comparing the backprojected image to the measured coil image for each of the multiple antenna elements to identify a set of affected voxels for each of the multiple antenna elements;
   wherein the identification of the at least one image artifact origin is performed in image space;
   wherein the identification of the at least one image artifact origin is performed at least partially using the set of affected voxels at least partially using the motion likelihood map and the fit or registration, wherein the at least one image artifact origin is corrected by numerically searching for a maximum of a consistency measure within a predetermined vicinity of each of the at least one image artifact origin before constructing the corrected SENSE image, wherein the consistency measure is dependent upon the difference between the set of affected voxels in the preliminary SENSE image and backprojected trial SENSE images for each of the multiple antenna elements, wherein the backprojected trial sense images are constructed from a trial SENSE image, wherein the trial sense image is constructed using a trial SENSE equation.

14. The method of claim 12, wherein the extended SENSE equation comprises an extended coil sensitivity matrix, wherein the extended coil sensitivity matrix is chosen to minimize a contribution from at least a portion of the at least one image artifact origin.

* * * * *